(12) United States Patent
Cavers

(10) Patent No.: US 6,414,546 B2
(45) Date of Patent: Jul. 2, 2002

(54) ADAPTIVE LINEARIZER FOR RF POWER AMPLIFIERS

(75) Inventor: James K. Cavers, Richmond (CA)

(73) Assignee: Simon Fraser University, Burnaby (CA)

(*) Notice: Subject to any disclaimer, the term of this patent is extended or adjusted under 35 U.S.C. 154(b) by 0 days.

(21) Appl. No.: 09/758,349

(22) Filed: Jan. 12, 2001

Related U.S. Application Data

(62) Division of application No. 09/305,312, filed on May 5, 1999, now Pat. No. 6,208,207.

(51) Int. Cl.⁷ .............................................. H03F 1/26
(52) U.S. Cl. ................................... 330/149; 330/151
(58) Field of Search .............................. 330/149, 151

(56) References Cited

U.S. PATENT DOCUMENTS

| | | | |
|---|---|---|---|
| 4,379,994 A | 4/1983 | Baumann | 330/149 |
| 4,879,519 A | 11/1989 | Myer | 330/149 |
| 5,307,022 A | 4/1994 | Tattersall, Jr. et al. | 330/52 |
| 5,485,120 A | 1/1996 | Anvari | 330/151 |
| 5,489,875 A * | 2/1996 | Cavers | 330/151 |
| 5,532,642 A | 7/1996 | Takai | 330/15 |
| 5,565,814 A | 10/1996 | Fukuchi | 330/52 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,644,268 A | 7/1997 | Hang | 330/151 |
| 5,694,395 A | 12/1997 | Myer et al. | 370/480 |
| 5,742,201 A | 4/1998 | Eisenberg et al. | 330/2 |
| 5,760,646 A | 6/1998 | Belcher et al. | 330/149 |
| 5,789,976 A | 8/1998 | Ghannouchi et al. | 330/52 |
| 5,815,036 A | 9/1998 | Yoshikawa et al. | 330/52 |
| 5,831,478 A | 11/1998 | Long | 330/52 |
| 5,862,459 A | 1/1999 | Charas | 455/144 |
| 6,166,601 A * | 12/2000 | Shalom et al. | 330/151 |
| 6,208,207 B1 * | 3/2001 | Cavers | 330/149 |

FOREIGN PATENT DOCUMENTS

EP 0675594 10/1995

OTHER PUBLICATIONS

S. Grant, "A DSP Controlled Adaptive Feedforward Amplifier Linearizer," Jul., 1996.
S. Grant and J. Cavers, "A DSP Controlled Adaptive Feedforward Amplifier Linearizer," ICUPC 1996.
A. Smith, "A Wideband Adaptive Feedforward Amplifier Lineariser," Aug. 1997.
A. Smith and J. Cavers, "A Wideband Architecture For Adaptive Feedforward Linearization," May 18, 1998.
F. Amoroso, "Spectral Containment By PreDistortion of OQPSK Signal," Oct., 1998.
J. Cavers, "Adaption Behavior of a Feedforward Amplifier Linearizer," Feb., 1995.
Q. Cheng, et al., A 1.9 GHZ Adaptive Feedforward Power Amplifier, Nov., 1998.
J. Chen, et al., "Adaptive joint lineraisation/equilisation with delay alignments for a wideband power amplifier," Mar., 1998.

* cited by examiner

*Primary Examiner*—Steven J. Mottola
(74) *Attorney, Agent, or Firm*—Fitzpatrick, Cella, Harper & Scinto

(57) ABSTRACT

A feedforward amplifier is disclosed in which either the main amplifier or the auxiliary amplifier includes at least three parallel signal paths. Each of the signal paths includes a complex gain adjuster. In addition, a feedforward amplifier is disclosed in which a plurality of control linearizers compensate for nonlinearities in the response of signal adjusters to control inputs.

19 Claims, 14 Drawing Sheets

ADAPTIVE LINEARIZER FOR RF POWER AMPLIFIERS

This is a division of application Ser. No. 09/305,312, filed May 5, 1999, now U.S. Pat. No. 6,208,207.

BACKGROUND OF THE INVENTION

This application pertains to improvements in linearization of radio frequency (RF) amplifiers to reduce the effects of intermodulation (IM) distortion.

All amplifiers are non-linear to some degree. If the signal carried by the amplifier has an envelope that fluctuates in magnitude, such as a multicarrier signal or a linear data modulation, then the non-linear operation generates intermodulation (IM) products in the amplifier output. These IM products represent unwanted interference in the operating band of the amplifier. Although it is possible to reduce the power of the IM products relative to the power of the desired signal by reducing the drive level of the amplifier, this expedient also reduces the power efficiency of the amplifier. Increasing the linearity of the amplifier by means of external circuitry can be a more efficient alternative.

A number of prior art approaches to this problem are described in U.S. Pat. No. 5,489,875, which is incorporated herein by reference. Some of the best prior art approaches described therein use a feedforward linearizer.

Traditional feedforward linearizers include a signal cancellation circuit and a distortion cancellation-circuit. The signal cancellation circuit has two branches, one of which contains the power amplifier whose output is to be linearized. In particular, the amplifier's output consists of an amplified version of an input signal, plus IM distortion. The other branch of the signal cancellation circuit contains circuitry characterized by a coefficient α (amplitude and phase) that can be adjusted to match the amplitude and phase shift of the amplifier, and a delay, also chosen to match the amplifier. If the match is perfect, the error signal obtained by subtracting the output of the two branches of the signal cancellation circuit equals the IM distortion. In the distortion cancellation circuit, an appropriately amplified and phase shifted version (coefficient β) of the distortion is subtracted from the amplifier output, ideally leaving only the linearly amplified replica at the feedforward output.

FIG. 1 shows an example of a traditional prior art feedforward amplifier. The incoming signal is split by splitter S1 into two paths comprising the signal cancellation circuit. The first path 10, 15, 20 contains a complex gain adjuster CGA1 and the main amplifier A1, the output 20 of which contains the amplified desired signal and unwanted IM distortion. Splitter S2 directs part of the main amplifier output along line 25 to combiner C1. The second path 30, 35, 40 carries the desired signal, delayed by delay line DL1 to match the delay in the first path, to another input of combiner C1. The complex gain adjuster CGA1 provides means to change the amplitude and phase so that the signal component is cancelled in combiner C1, leaving only the IM distortion at line 45. The distortion cancellation circuit also consists of two branches. In one, the IM distortion on line 45 passes through complex gain adjuster CGA2 and auxiliary amplifier A2 to combiner C2, which receives at its other input 70 the main amplifier output, delayed in delay line DL2 to match the delay of path 25, 45, 50, 55, 60. When complex gain adjuster CGA2 is correctly adjusted, the IM distortion is cancelled in combiner C2, leaving only the amplified input signal at its output 75.

Typical implementations of the complex gain adjuster are shown for polar coordinates in FIG. 2(a) and for rectangular coordinates in FIG. 2(b). The input, output and two components of complex gain are denoted by I, O, GA and GB, respectively.

The complex gain adjuster CGA1 can alternatively be placed in line 30, although doing so precludes cancellation of any distortion introduced by the complex gain adjuster itself.

Because feed forward linearization is based on subtraction of nearly equal quantities, its major parameters must adapt to changes in operating environment, such as signal level, supply voltage and temperature.

The "minimum power" principle may be implemented in the prior art feedforward amplifier of FIG. 1. In the signal cancellation circuit, controller CT1 operates to minimize the power measured on line 100 using control lines 110 and 115 to complex gain adjuster CGA1. This approach does not make use of line 105. Instead, the system increments the voltages on control lines 110, 115 in the direction that results in a lower power measured on line 100.

The "gradient" method is an alternative to the minimum power principle for adaptation. FIG. 3 shows that the signal cancellation controller CT1 is a bandpass correlator. The signal for which the power is to be minimized at input I and a reference signal at input R are split in splitters S101, S102, respectively, and one of them is phase shifted by 90 degrees in phase shifter PS1. Two bandpass mixers M101, M102 produce outputs for which the mean value indicates the direction and size of increments to the complex gain components. Integrators I1, I2 remove high frequency noise and sum the increments to produce the complex gain components at outputs GA and GB. The controller therefore operates to bring the mean value of the gradient to zero. Numeric designations on the input and output lines indicate where the bandpass controller is connected in the signal cancellation circuit. Other embodiments of the gradient method adapt the control voltages to complex gain adjuster CGA1 similarly. The gradient method is faster than previously proposed minimum power methods and does not require deliberate misadjustments in order to determine the direction of change. However, it is sensitive to DC offset at the output of the mixers that create the gradient signal.

The gradient method can also be applied to adaptation of the FIG. 1 distortion cancellation circuit, as indicated in FIG. 3 by the numeric designations in parentheses. Specifically, controller CT2 operates to bring the mean value of the correlation between the signal on line 85 and the signal on line 95 to zero using control lines 120 and 125 to complex gain adjuster CGA2.

A number of more sophisticated approaches are also disclosed in the '875 patent. In one of these approaches, the delay, gain and phase differences are automatically adjusted according to a gradient principle, instead of merely adjusting the gain and the phase.

The '875 patent also discloses approximating the gradient as a sum of partial gradients taken over limited bandwidths. In the case of the distortion cancellation circuit, this allows calculation of the gradient over selected frequency bands that do not contain the amplified input signal, in order to reduce the masking effect. The use of limited bandwidth for each partial gradient allows use of digital signal processing technology to perform the calculation, thereby eliminating the DC offset that could otherwise cause convergence to an incorrect value.

The '875 patent also discloses automatically adjusting the differences to minimize the power at the output of the corresponding cancellation circuit. At each adjustment step, a set of measurements corresponding to perturbed values of the parameters (describing delay, gain and phase) is made. From these measurements, an estimate of the gradient of the power surface is formed. All the parameters describing delay, gain and phase are then adjusted in a direction opposite to the gradient, thereby effecting the greatest decrease in the power to be minimized. In the case of the distortion cancellation circuit, the power to be minimized is the sum of powers measured in selected frequency bands that do not contain the amplified input signal, in order to reduce the masking effect.

FIG. 4 depicts another prior art feed forward amplifier that is disclosed in the '875 patent. The input signal on line 5 enters the signal cancellation circuit, where splitter S1 produces two branches. The upper branch consists of the delay, gain and phase adjusting circuit DGPA1 (described below) between lines 10 and 15, the main amplifier A1, and line 25 to combiner C1. The lower branch consists of delay line DL1 and line 40 to combiner C1. The delay in delay line DL1 is selected to be approximately equal to the maximum delay expected in the main amplifier. When adjusted properly, the desired signal is cancelled on line 45, leaving only the distortion and noise generated in the upper branch. The distortion cancellation circuit also has two branches. The upper branch consists of delay line DL2 and line 70 to combiner C2. The lower branch consists of splitter S4, complex gain adjuster DGPA2, auxiliary amplifier A2 and line 60 to combiner C2. When adjusted properly, the distortion is cancelled on line 75, leaving only the desired signal. Controllers CT3 and CT4 operate to adapt the delay, gain and phase in the signal cancellation and the distortion cancellation circuits, respectively.

FIG. 5(*a*) shows the preferred embodiment of the delay, gain and phase adjustment circuits DGPA1, DGPA2 shown in FIG. 4. Line numbers and block numbers shown without parentheses are associated with connections in the signal cancellation circuit, whereas line numbers and block numbers shown in parentheses are associated with connections in the distortion cancellation circuit. This convention is followed consistently below. The signal is split in splitter S7 into a main branch consisting of splitter S8 and complex gain adjuster CGA3, and a delayed branch consisting of delay line DL3 and splitter S9. The branches are recombined in combiner C3. The delay in delay line DL3 is selected to be approximately equal to the difference between the maximum and minimum expected delays in the main amplifier over the range of operating conditions. Appropriate settings of complex gain adjusters CGA4 and CGA3 allow line 15 to carry an interpolation of the delayed signal on line 135 and the undelayed signal on line 150. Such interpolations can approximate the input signal with a delay ranging from zero to the delay of delay line DL3. Approximations of delays outside this range are also possible, but with decreasing accuracy.

FIG. 5(*b*) shows an alternative embodiment of delay, gain and phase adjustment circuits DGPA1, DGPA2. This embodiment forms on lines 170 and 205 the sum and the difference of the delayed and undelayed signals, respectively; combiner C5 being arranged to subtract its inputs 185 and 200. The circuit applies the complex gain adjustments to the sum and the difference before recombination. It has the advantage of reducing the degree of interaction between the two branches, so that complex gain adjuster CGA4 can be adjusted substantially independently of complex gain adjuster CGA3. Other linear combinations of the delayed and undelayed signals, and of additional signals at intermediate values of delay, are contemplated as falling within the scope of U.S. Pat. No. 5,489,875.

Although delay, gain and phase comprise three parameters, there are four control lines to the delay, gain and phase adjuster circuit (i.e. lines 102, 103, 107, 108 for delay, gain and phase adjuster DGPA1; and, lines 127, 128, 122, 123 for delay, gain and phase adjuster DGPA2). This allows an additional degree of freedom in compensating frequency dependent effects in the signal cancellation circuit, and the adaptation methods described below take full advantage of this degree of freedom.

The delay, gain and phase adjuster circuit can alternatively be placed in the lower branch of the signal cancellation circuit, on line 30, although doing so allows any distortions introduced in the delay, gain and phase adjuster circuit to appear at the final output 75 without being cancelled themselves.

The '875 patent also discloses making the delay, gain and phase adjuster circuit adaptive by the gradient principle. FIG. 6 shows a detailed view of controller CT3 (or CT4) in the signal cancellation circuit of FIG. 4. Again, line numbers and block numbers shown without parentheses are associated with connections in the signal cancellation circuit, whereas line numbers and block numbers in parentheses indicate connections in the distortion cancellation circuit. By means of dual bandpass correlators, each controlling one of the complex gain adjusters in FIG. 5(*a*) or in FIG. 5(*b*), the controller drives to zero the correlation between the undelayed input signal at input R and the distortion signal at input I and the correlation between the delayed input signal at input RD and the distortion signal at input I. The speed of convergence is determined by the gains of the several components in the adaptation loop.

Outputs GA, GB, GAD and GBD from the controller of FIG. 6 are connected to the corresponding inputs of the delay, gain and phase adjusters shown in FIGS. 5(*a*) and 5(*b*) through lines 107 (122), 108 (123), 102 (127) and 103 (128). Conversion from rectangular to polar coordinates decreases the convergence time if the complex gain adjusters CGA4, CGA3, CGA6 or CGA5 are implemented in polar coordinates, as shown in FIG. 2(*a*), but this is not essential.

The '875 patent also describes operating the controllers CT3 and CT4 according to a "partial gradient" principle, as illustrated in FIG. 7. A local oscillator LO1 shifts a selected narrow spectral region of the undelayed input signal at input R, the delayed input signal at input RD, and the fed back signal at line I to an intermediate frequency, where the bandpass correlations are performed substantially as in FIG. 6. Shifting and bandwidth limitation are performed in the mixer/bandpass filter combinations M2 and BPF2, M3 and BPF3, and M1 and BPF1. The bandwidth of the bandpass filters is significantly less than the operating bandwidth of the amplifier, so that only a partial gradient is produced. In operation, the output frequency of oscillator LO1 is stepped across the operating band. The sum of the resulting partial correlations is a good approximation to the full gradient calculated by the circuit in FIG. 6, and the integrators contained in bandpass correlators BPC3 and BPC4 inherently perform such a summation.

One advantage of the partial gradient principle applied to controller CT4 in the distortion cancellation circuit is that it can reduce the masking effect of the desired signal on line 85. In the case of a multicarrier signal, as shown in FIG. 8(*a*), the bandwidth of the bandpass filter is selected not to exceed the bandwidth of each carrier, and the output frequency of oscillator LO1 steps in increments of multiples of the minimum carrier spacing, selecting only those carrier locations that contain distortion and noise, with no component of the input signal. The resulting sum of selected partial correlations is only an approximation of the true gradient, but it has much improved signal to noise ratio. In the case of a single carrier, as shown in FIG. 8(b), the "skirts" of the spectrum contain IM distortion, and the partial gradients are calculated only in these skirts, and include no component of the desired signal. Similarly, but with less advantage, controller CT3 in the signal cancellation circuit can apply the partial gradient principle. In this case, the oscillator LO1 selects only those spectral regions that contain the carriers or the desired signal, in order to minimize masking effects of the distortion and noise.

A second advantage of the partial gradient controller is that the narrower bandwidth lends itself to implementation of the correlation operation by means of digital signal processing technology. As explained in the '875 patent, the DC offsets inherent in analog mixers can, in consequence, be eliminated. FIG. 9 shows one such prior art embodiment. As in FIG. 7, oscillator LO1 and mixer/bandpass filter combinations M2 and BPF2, M3 and BPF3, and M1 and BPF1 shift narrow spectral regions of the undelayed input signal at input R, the delayed input signal at input RD, and the fed back signal at input I all to an intermediate frequency $f_I$. A second stage of down conversion shifts the outputs of bandpass filters to a range suitable for further processing in the digital signal processor DSP1. This second stage is accomplished by oscillator LO2, which produces a carrier at frequency $f_I$-W/2, where W is the bandwidth of the bandpass filters BPF2, BPF3 and BPF1, and by mixer/bandpass filter combinations M5 and BPF5, M6 and BPF6, and M4 and BPF4. The outputs of the bandpass filters are centered at frequency W/2 and have bandwidth less than W. The DC offsets at the outputs of mixers M5, M6 and M4 are thereby eliminated. The bandpass filter outputs are then sampled at a rate at least equal to 2 W per second and converted to digital format in analog to digital converters ADC2, ADC3 and ADC1, from which they enter digital signal processor DSP1. The digital signal processor program operates as a pair of bandpass correlators to create the control signals GA, GB, GAD, and GBD through digital to analog converters DAC1, DAC2, DAC3 and DAC4.

If controllers CT3 or CT4 operating according to the partial gradient principle are employed with the sum and difference form of the delay, gain and phase adjuster circuit illustrated in FIG. 5(b), then the line designations 106 (121), 107 (102), 108 (123), 101 (126), 102 (127) and 103 (128) indicate the connections between the controller and the delay, gain and phase adjuster circuit.

A particular configuration of the partial gradient controller is applicable when delay variations in the main and auxiliary amplifiers are not significant, and it is sufficient to employ a complex gain adjuster instead of a full delay, gain and phase adjuster. FIG. 10 illustrates this prior art use of the partial gradient controller in the signal cancellation circuit, where the oscillator LO1 steps across the operating band, selecting frequency bands that contain the desired signal. Comparison with FIG. 7 demonstrates considerable simplification. When this simplified form of the partial gradient controller is used for controller CT4 of the distortion cancellation circuit, the oscillator selects frequency bands that contain IM products that do not contain the desired signal, in order to reduce the masking effect.

The digital signal processing implementation of the partial gradient controller is similarly simplified when delay variations in the main and auxiliary amplifiers are not significant, and it is sufficient to employ a complex gain adjuster instead of a full delay, gain and phase adjuster. FIG. 11 illustrates this prior art configuration; it is considerably simpler than FIG. 9, but it retains the advantage of eliminating DC offset. When this controller is employed in the signal cancellation circuit, as illustrated, the oscillator LO1 selects bands containing the desired signal. Conversely, when it is used for controller CT4 of the distortion cancellation circuit, the oscillator selects bands that contain IM products that do not contain the desired signal.

SUMMARY OF THE INVENTION

In accordance with one aspect of the present invention, an amplifier is provided. The amplifier includes a main amplifier, a main signal adjuster, a first subtracter, and a main controller. The main amplifier generates an intermediate amplified signal. The main signal adjuster includes at least three parallel signal paths that couple an input signal to the main amplifier, with each of the parallel signal paths including a complex gain adjuster that is controlled by main control inputs. The first subtracter subtracts a delayed version of the input signal from the intermediate signal, resulting in an error signal. Based on the error signal, the main controller generates main control signals which are provided to the main control inputs of the main signal adjuster.

According to another aspect of the present invention, an amplifier is provided. The amplifier includes a main amplifier, a main signal adjuster, a first subtracter, and a main controller. It also includes an auxiliary amplifier, an auxiliary signal adjuster, a second subtracter, and an auxiliary controller. The main amplifier generates an intermediate amplified signal. The main signal adjuster couples an input signal to the main amplifier, and includes a complex gain adjuster that is controlled by main control inputs. The first subtracter subtracts a delayed version of the input signal from the intermediate signal, resulting in an error signal. Based on the error signal, the main controller generates main control signals which are provided to the main control inputs of the main signal adjuster. The auxiliary amplifier generates an amplified version of the error signal. The auxiliary signal adjuster includes at least three parallel signal paths that couple the error signal to the auxiliary amplifier, with each of the parallel signal paths including a complex gain adjuster that is controlled by auxiliary control inputs. The second subtracter subtracts the amplified version of the error signal from a delayed version of the intermediate signal, resulting in an output signal. Based on the output signal, the auxiliary controller generates auxiliary control signals which are provided to the auxiliary control inputs of the auxiliary signal adjuster.

According to another aspect of the present invention, a method of amplifying a signal is provided. The method includes the steps of amplifying a combination of at least three adjusted versions of an input signal, resulting in an intermediate signal. Each of the adjusted versions of the input signal comprises a phase, gain, and delay adjusted version of the input signal, and the delays in each of the at least three adjusted versions are all different. A delayed version of the input signal is subtracted from the intermediate signal, resulting in an error signal. Each of the adjusted versions of the input signal is modified based on the error signal.

According to another aspect of the present invention, a method of amplifying a signal is provided. The method includes the steps of amplifying an adjusted version of an input signal, resulting in an intermediate signal. A delayed version of the input signal is subtracted from the intermediate signal, resulting in an error signal. Each of the adjusted versions of the input signal is modified based on the error signal. A combination of at least three adjusted versions of the error signal is amplified, resulting in an amplified version of the error signal. Each of the adjusted versions of the error signal comprises a phase, gain, and delay adjusted version of the error signal, and the delays in each of the at least three adjusted versions are all different. In addition, an adjusted version of the error signal is amplified, resulting in an amplified version of the error signal. The amplified version of the error signal is subtracted from a delayed version of the intermediate signal, resulting in an output signal. The adjusted version of the error signal is modified based on the output signal.

According to another aspect of the present invention, an amplifier is provided. The amplifier includes a main amplifier, a main signal adjuster, a first subtracter, and a main controller. The main amplifier generates an intermediate amplified signal. The main signal adjuster couples an input signal to the main amplifier, including at least one complex gain adjuster that is controlled by main control inputs. The first subtracter subtracts a delayed version of the input signal from the intermediate signal, resulting in an error signal. In addition, based on the error signal, a main controller generates main control signals which are provided to the main control inputs of the main signal adjuster. The main controller includes at least one control linearizer which adjusts the main control signals to compensate for nonlinearities in the main signal adjuster's response to the main control inputs.

According to yet another aspect of the present invention, an amplifier is provided. The amplifier includes a main amplifier, a main signal adjuster, a first subtracter, and a main controller. It also includes an auxiliary amplifier, an auxiliary signal adjuster, a second subtracter, and an auxiliary controller. The main amplifier generates an intermediate amplified signal. The main signal adjuster couples an input signal to the main amplifier, and includes a complex gain adjuster that is controlled by main control inputs. The first subtracter subtracts a delayed version of the input signal from the intermediate signal, resulting in an error signal. Based on the error signal, the main controller generates main control signals which are provided to the main control inputs of the main signal adjuster. In addition, an auxiliary amplifier generates an amplified version of the error signal. The auxiliary signal adjuster couples the error signal to the auxiliary amplifier, and includes at least one complex gain adjuster that is controlled by auxiliary control inputs. The second subtracter subtracts the amplified version of the error signal from a delayed version of the intermediate signal, resulting in an output signal. Based on the output signal, the auxiliary controller generates auxiliary control signals which are provided to the auxiliary control inputs of the auxiliary signal adjuster. The auxiliary controller includes at least one control linearizer which adjusts the auxiliary control signals to compensate for nonlinearities in the auxiliary signal adjuster's response to the auxiliary control inputs.

DETAILED DESCRIPTION OF THE PREFERRED EMBODIMENTS

Figure 12:
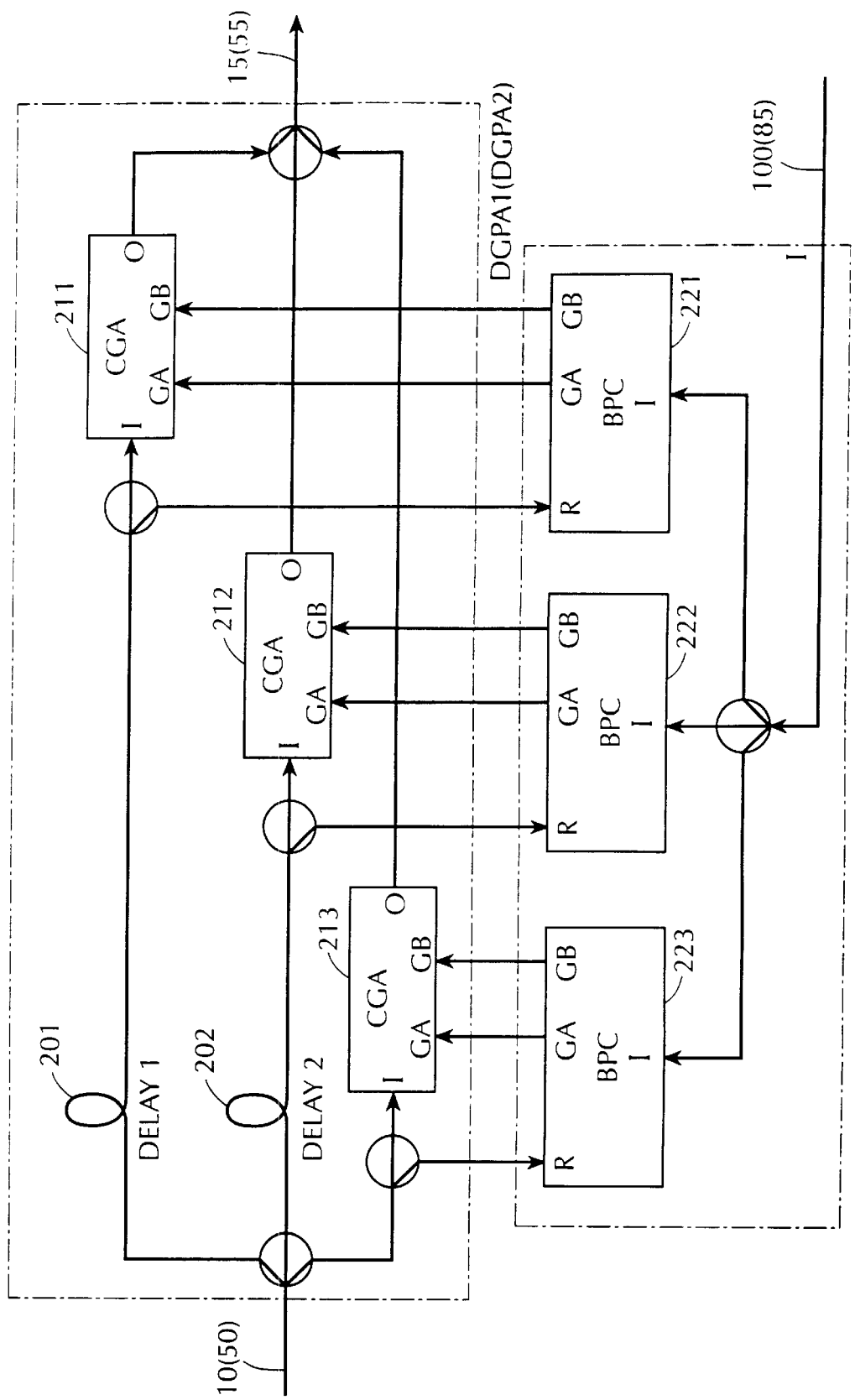
FIG. 12 is a block diagram of an improved controller and delay/gain/phase adjuster in accordance with the present invention.

FIG. 12 shows an improved arrangement for the delay, gain and phase adjuster (DGPA) and the controller CT3 (CT4). This improved DGPA and controller set is used to replace the corresponding components in prior art feedforward amplifiers such as the feedforward amplifier of FIG. 4. Unlike the prior art amplifiers, which have two parallel adjustable branches in the DGPA, the feedforward amplifier in accordance with the present invention includes a larger number of branches.

In FIG. 12, the input signal 10 is split into three branches. The first branch includes a delay element 201 and a complex gain adjuster (CGA) 211. The second branch includes a delay element 202 and a CGA 212. The third branch includes a CGA 213, but does not include a delay element (although it will have an associated incidental delay inherent in the circuit components and interconnections, which can be ignored). Each of the CGAs 211–213 is independently controlled by a pair of signals GA and GB. These signal pairs are provided from the controller CT3 (CT4). In addition, a splitter provided at the input each of the CGAs 211–213 provides a copy of the CGA's input signal to the controller CT3 (CT4). The outputs of the CGAs 211–213 are then combined in a combiner and provided as an output signal 15 to the main amplifier (A1, Shown in FIG. 4).

Compensation for non-linearities is accomplished by adjusting the GA and GB signal pairs corresponding to each of the branches. These GA/GB signal pairs are applied, respectively, to each CGA in the DGPA. The adjustments for each individual signal pair occurs in the same manner as in a corresponding signal pair in the two branch circuit of the prior art.

Providing the additional branch in accordance with the present invention results in an improved ability to compensate for frequency dependencies that are not monotonic in frequency, and frequency dependencies that exhibit non-linearity as a function of frequency. This aspect of the invention facilitates compensation, for example, for components with frequency responses that increase in one region of the operating band, and decrease in another region. This provides a significant advantage over prior art amplifiers.

While FIG. 12 shows that the DGPA contains three branches (each with its own CGA), and that the controller CT3 has three control channels, this arrangement can be extended to four or more branches by adding additional parallel branches to the DGPA, with each additional branch containing a CGA and a delay element. A corresponding number of bandpass correlators should also be added to the controller. The delay times of the various delay elements 201, 202 (and any additional delay elements, not shown), should be selected so that none of the delay times are equal.

Figure 7:
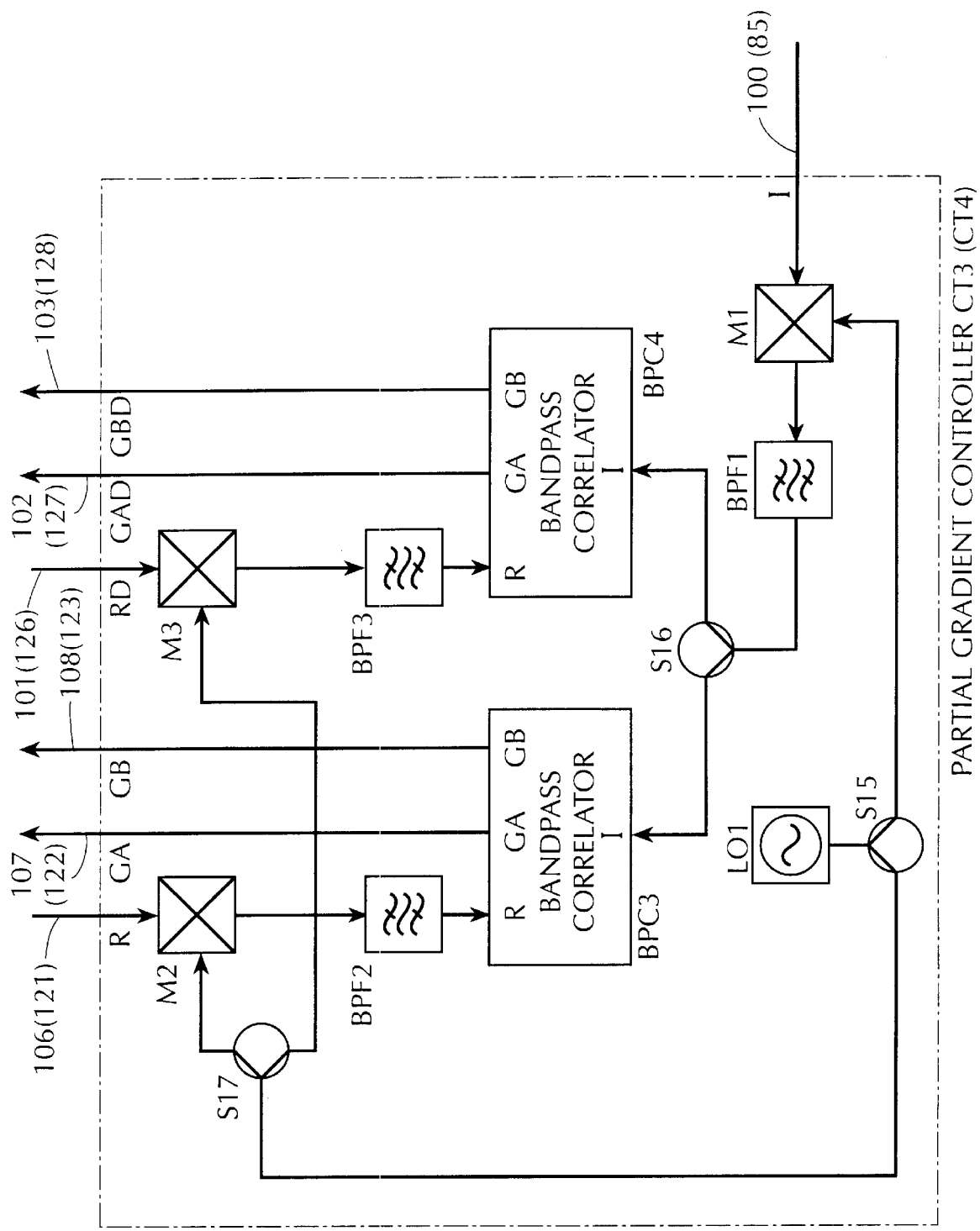
FIG. 7 is a block diagram of components comprising the controller portions of the FIG. 4 amplifier, which embody the partial gradient principle to adapt the delay, gain and phase adjusting circuit.
Figure 8A:
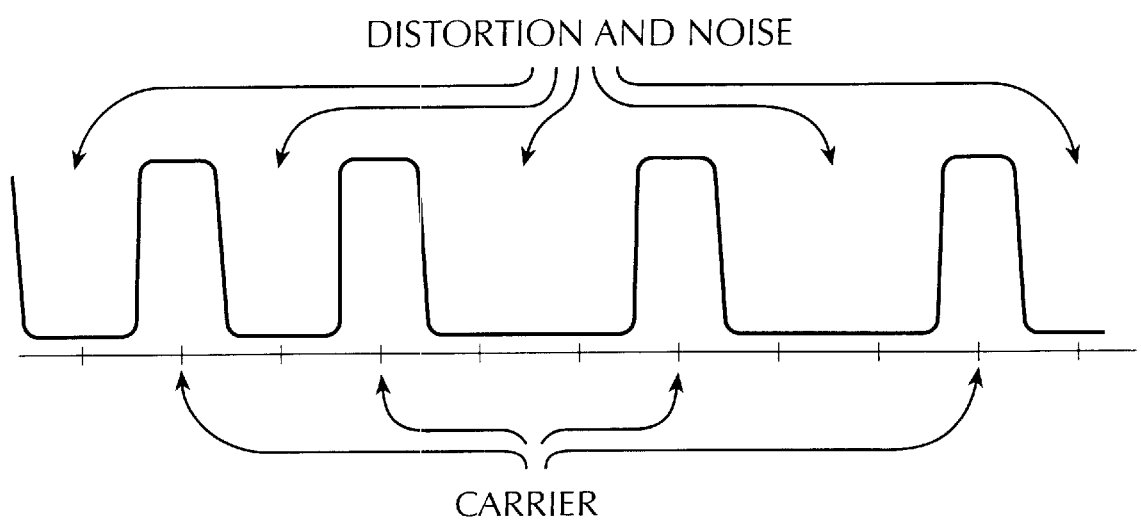
FIGS. 8(a) and 8(b) respectively depict carrier and distortion spectra of the FIG. 4 amplifier for multicarrier and for single carrier inputs.
Figure 8B:
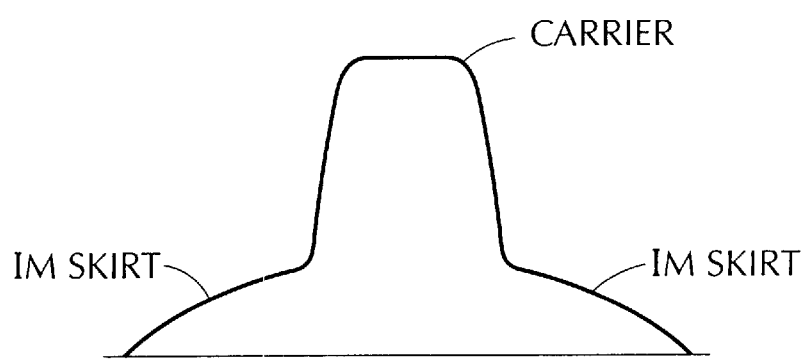
Figure 9:
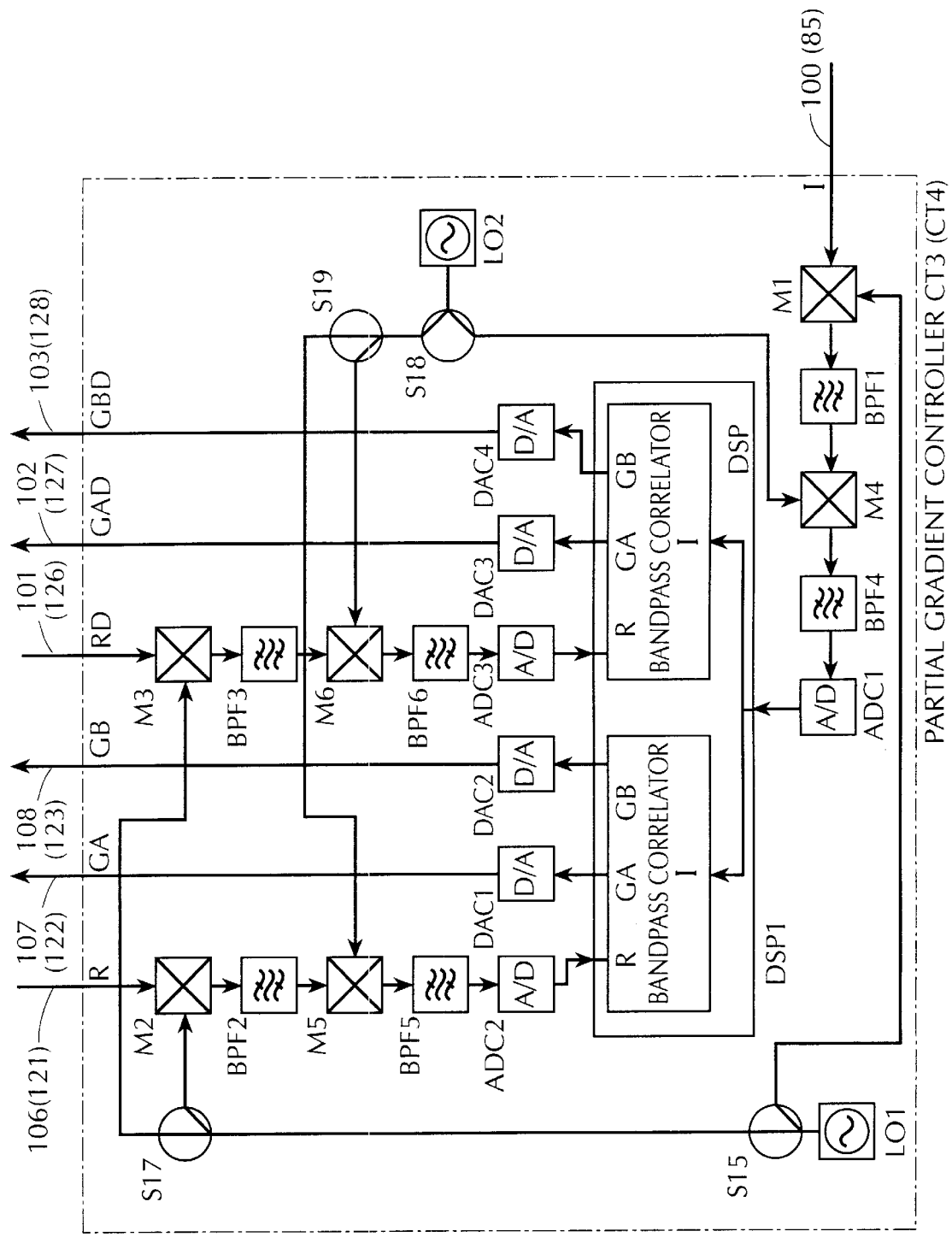
FIG. 9 is a block diagram of components comprising the controller portions of the FIG. 4 amplifier, which employ the partial gradient principle implemented with digital signal processing circuitry to adapt the delay, gain and phase adjusting circuit.
Figure 10:
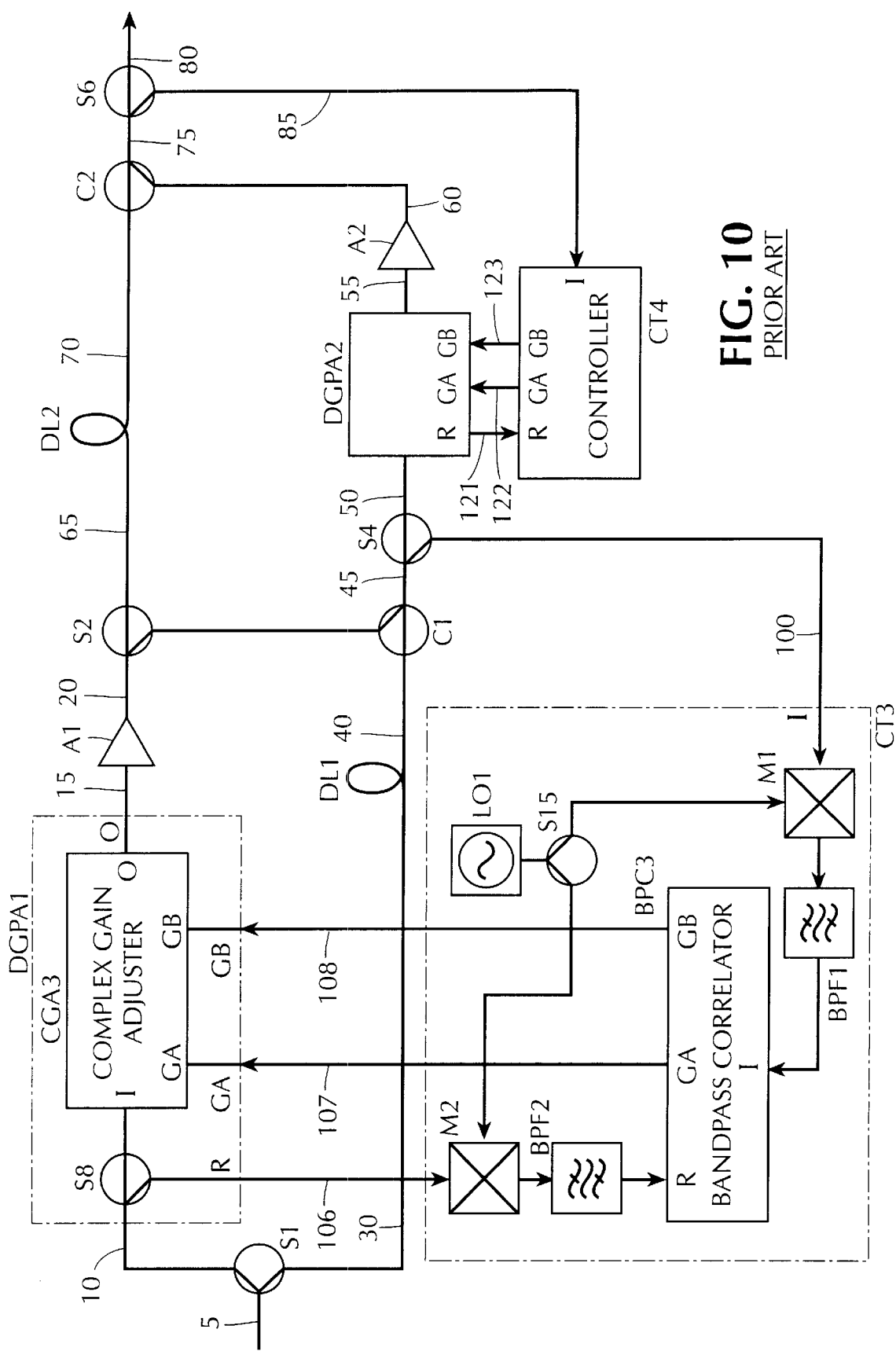
FIG. 10 is a block diagram of another prior art adaptive feedforward amplifier which employs the partial gradient principle to adapt the complex gain adjusting circuit for the case in which delay variations are not significant.
Figure 11:
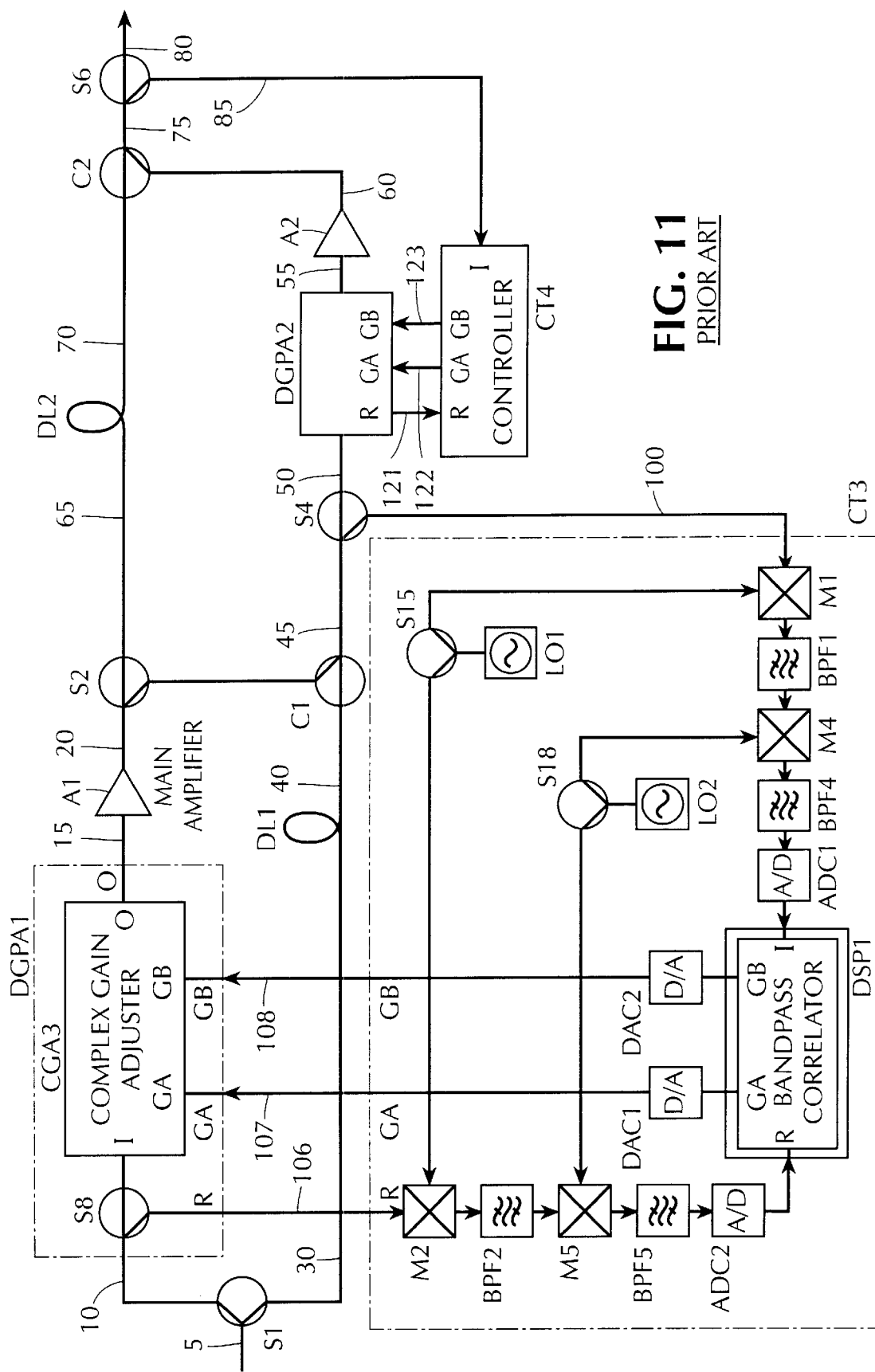
FIG. 11 is a block diagram of another prior art adaptive feedforward amplifier constructed which employs the partial gradient principle implemented with digital signal processing circuitry to adapt the complex gain adjusting circuit for the case in which delay variations are not significant.

In addition, while FIG. 12 shows that the controller CT3 (CT4) comprises three bandpass correlators 221–223, other types of controllers may be substituted. For example, the partial gradient controller shown in FIG. 7 may be modified to form a three branch controller, in accordance with this aspect of the present invention, by adding an additional bandpass correlator, bandpass filter and mixer, and replacing the splitters S16 and S17 with three-way splitters. Additional channels may also be added, in a similar manner, to the DSP-based partial gradient controller CT3 (CT4) shown in FIG. 9.

The three-branch arrangement shown in FIG. 12 may be used in either the signal cancellation section or the distortion cancellation section of the feedforward amplifier, or in both of those sections.

Figure 2A:
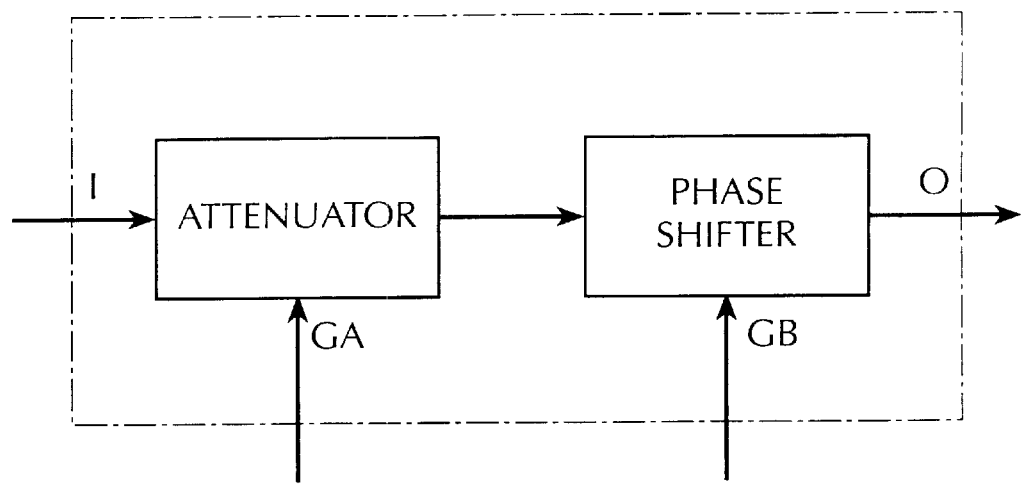
FIGS. 2(a) and 2(b) respectively depict polar and rectangular coordinate implementations of the complex gain adjuster portion of the FIG. 1 amplifier.
Figure 2B:
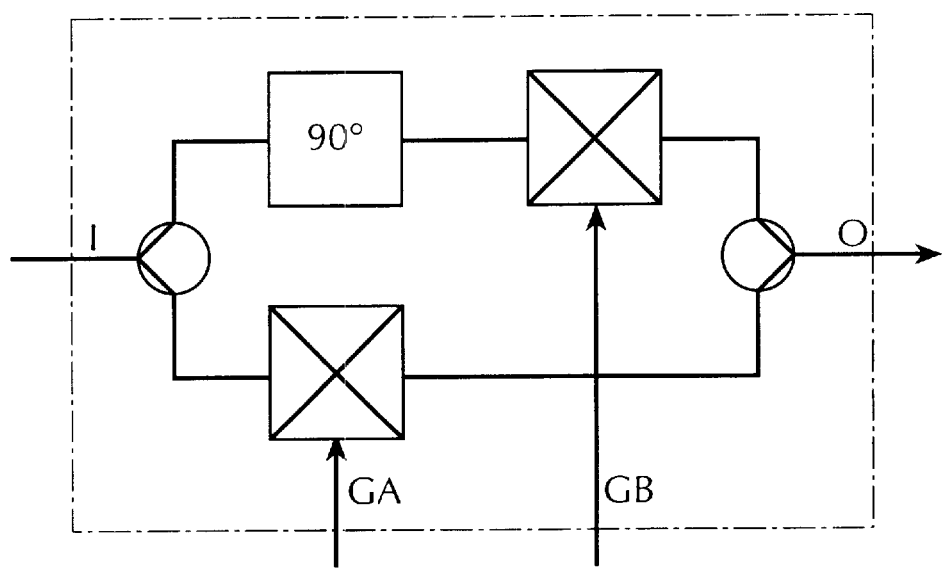
Figure 3:
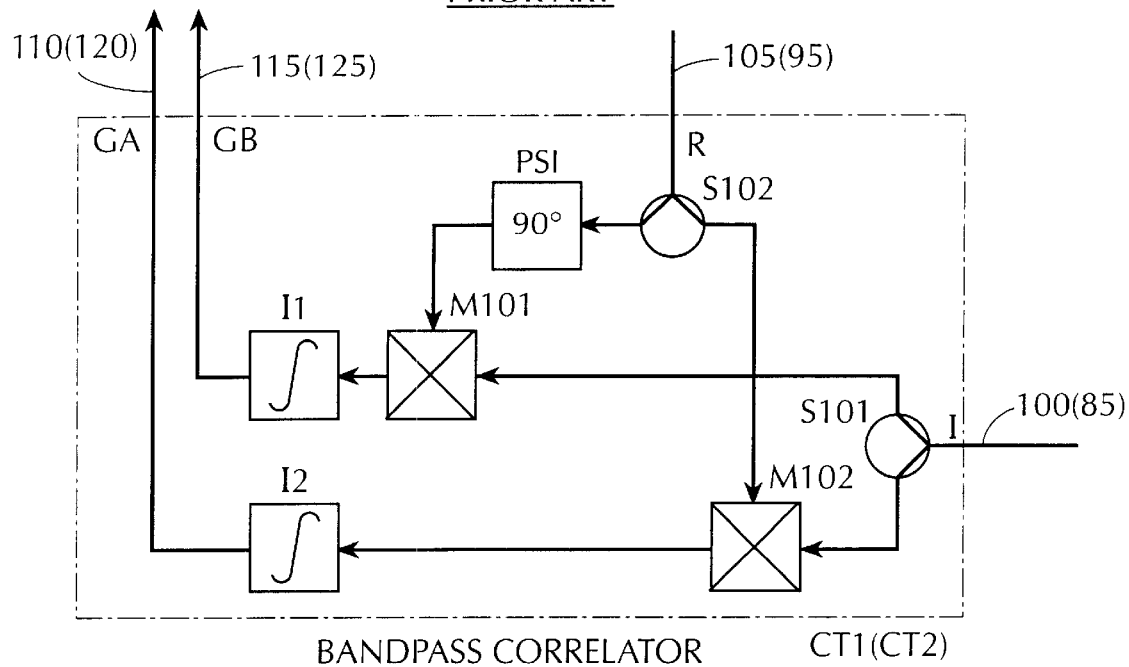
FIG. 3 is a block diagram of the components comprising the bandpass correlator implementation of the controller portions of the FIG. 1 amplifier.
Figure 6:
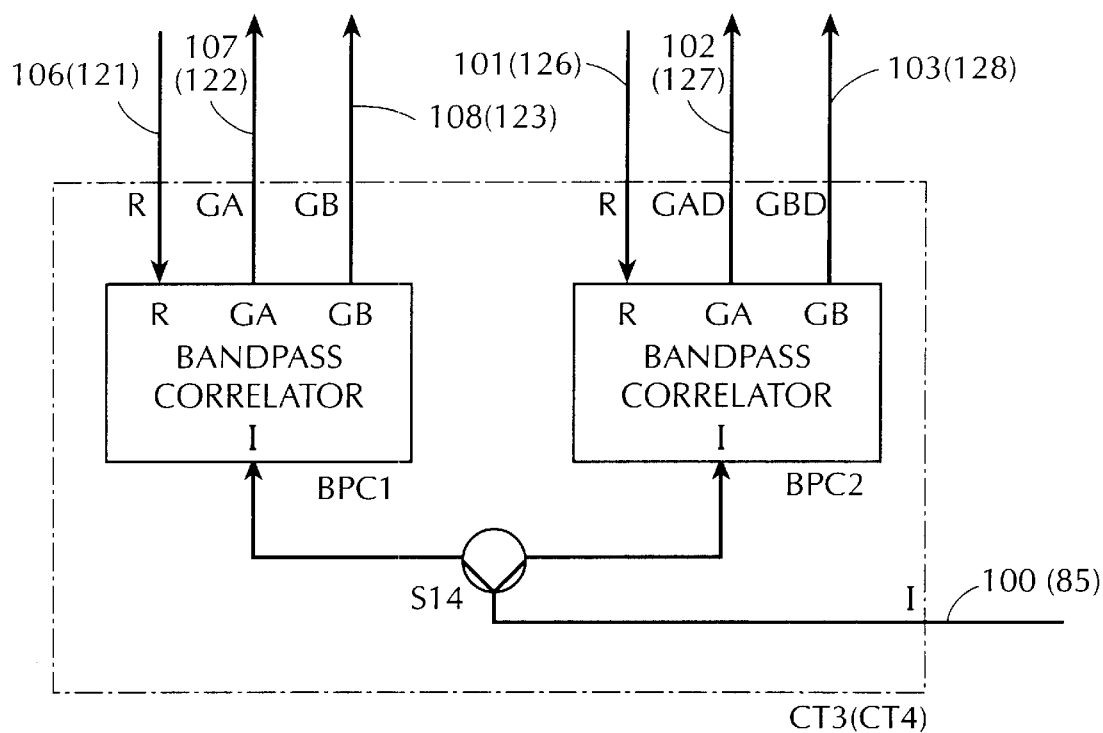
FIG. 6 is a block diagram of components comprising the controller portions of the FIG. 4 amplifier, which embody the gradient principle to adapt the delay, gain and phase adjusting circuit.
Figure 4:
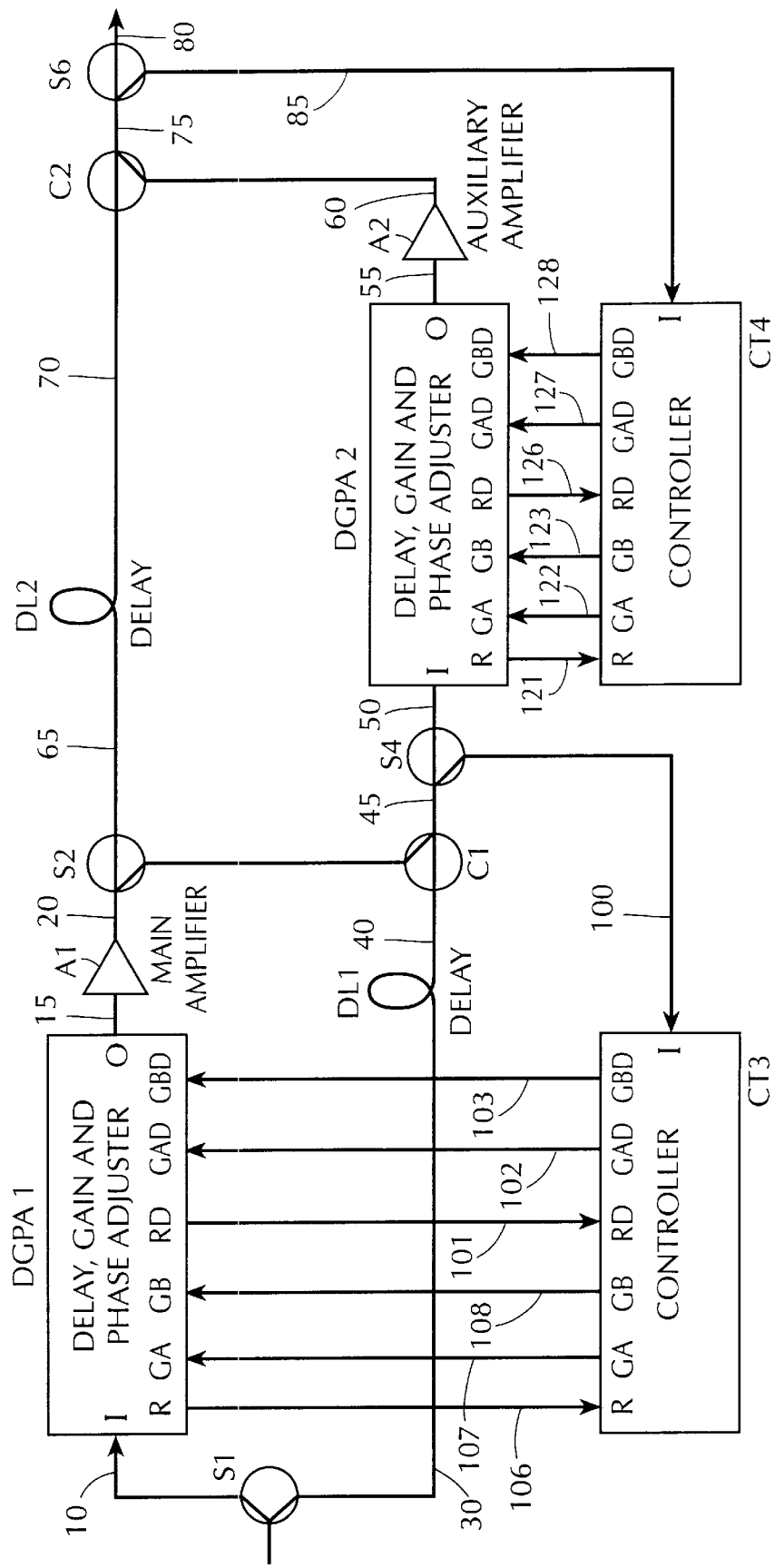
FIG. 4 is a block diagram of an adaptive feedforward linearizer constructed in accordance with a another prior art amplifier that includes delay, gain and phase adjusting circuits.
Figure 5A:
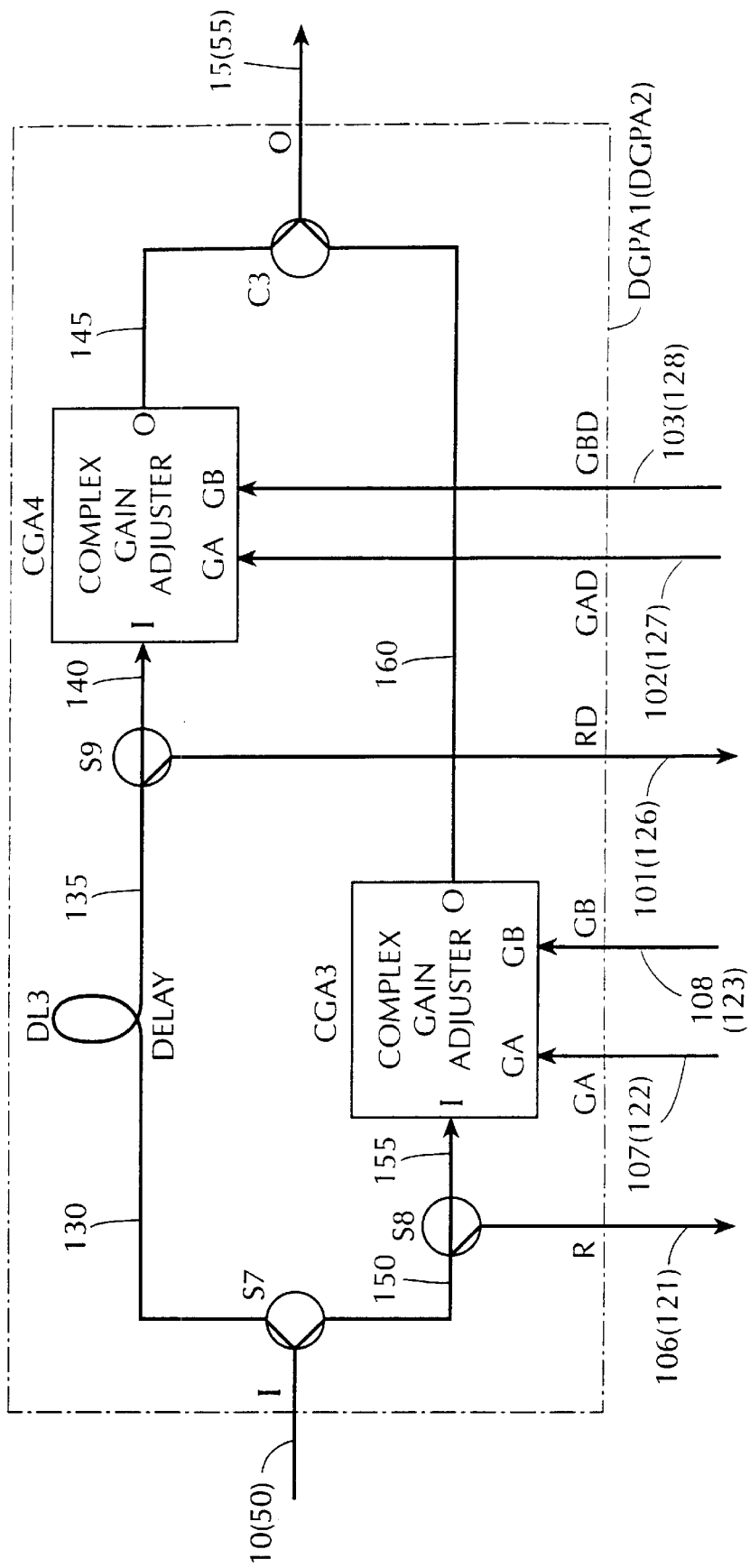
FIGS. 5(a) and 5(b) respectively depict two alternative embodiments of a delay, gain and phase adjusting circuit for adaptive feedforward linearizers constructed in accordance with the prior art amplifier of FIG. 4.
Figure 5B:
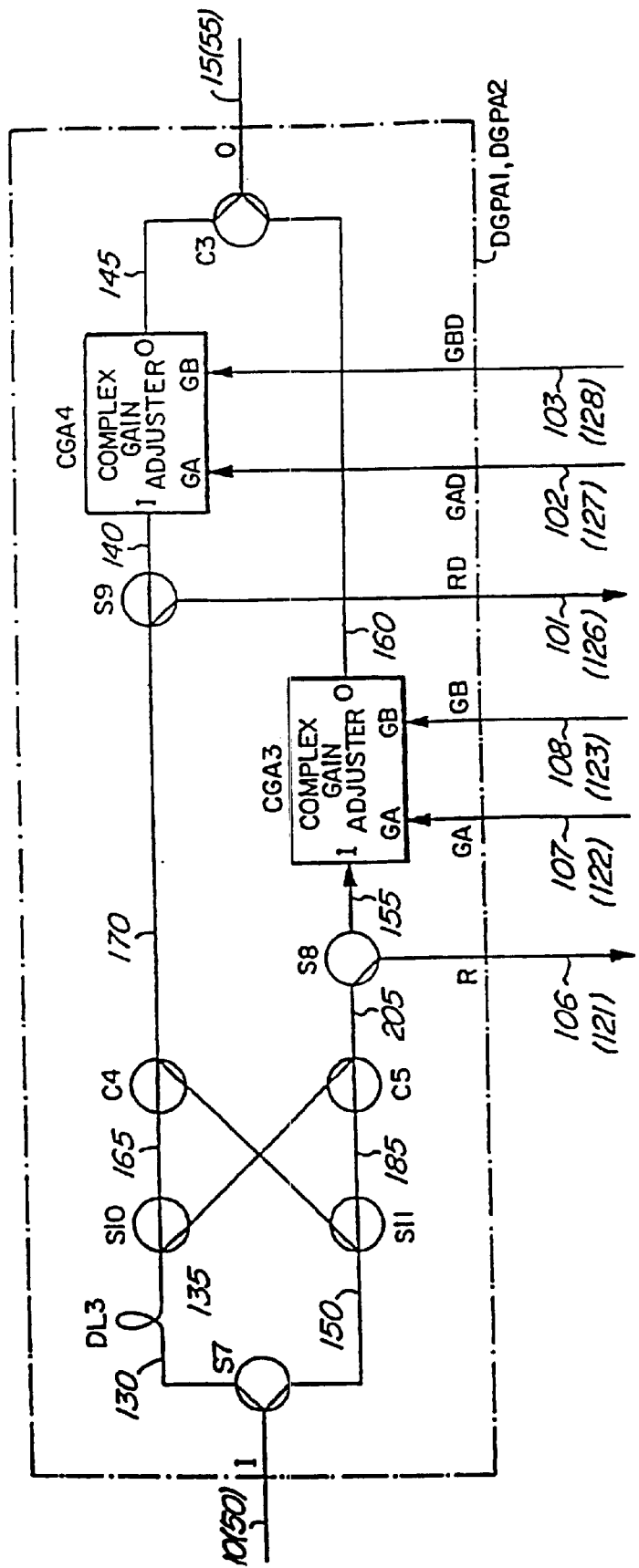
Figure 13:
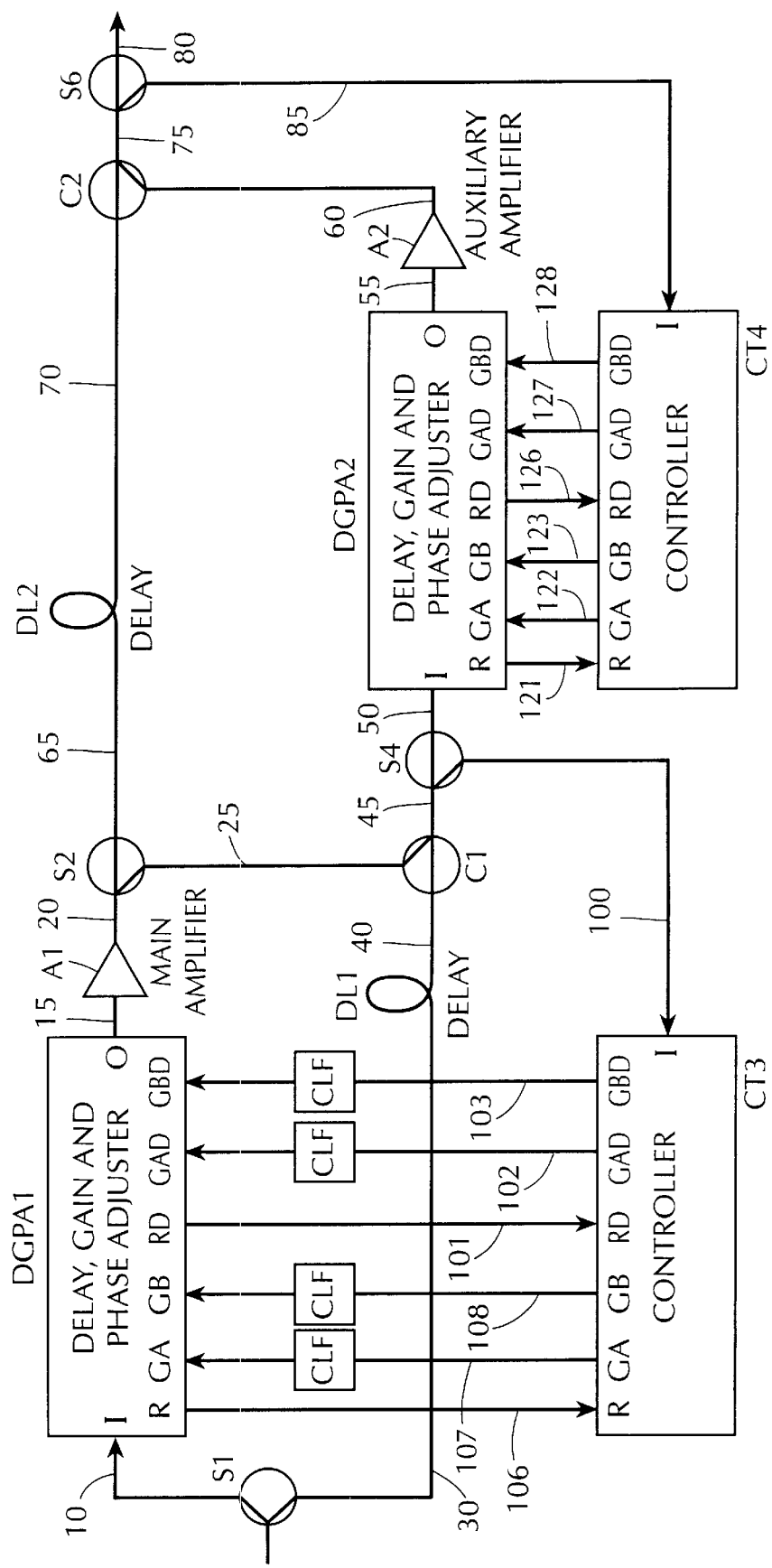
FIG. 13 depicts a feedforward amplifier that incorporates control linearization functions in accordance with the present invention.

FIG. 13 depicts a second aspect of the present invention. Because the response of typical CGAs (like those illustrated in FIGS. 2A and 2B) is not linear with respect to the control voltages, changes in the CGA output are typically not proportional to changes in the inputs GA and GB. For example, in the CGA of FIG. 2B, the gains in the two branches may not be proportional to the signals arriving at the GA and GB inputs, causing the amplitude gain and the phase shift of the complex gain adjuster to be different from sqrt($GA^2+GB^2$) and $tan^{-1}$(GB/GA), respectively. Since the complex gain adjusters (CGA) are located within the feed forward loop, these non-linearities do not appear in the output signal 80 (FIG. 4). But these non-linearities do slow the adaptation of the feed forward amplifier (i.e. the time needed to linearize the amplifier).

FIG. 13 shows an arrangement, in accordance with the present invention, in which the adaptation of the feed forward amplifier is significantly improved by adding control linearization functions (CLFs) between the controller CT3 and the delay, gain, and phase adjuster DGPA1. The CLFs map their input voltage to a corresponding output voltage in accordance with a transfer function, which is preferably selected to approximate the inverse of the transfer function of the respective CGA. For example, if the output response of a given CGA is proportional to the square of the input voltage, the preferred transfer function for the CLF will be $V_{OUT}$=sqrt($V_{IN}$). With this arrangement, the combination of each CGA and its respective CLF will produce an output that is linear with respect to the input signal applied to the CLF. These CLF transfer functions are preferably determined at design time and are not affected by the choice of the power amplifier stage that follows the DGPA.

Figure 14:
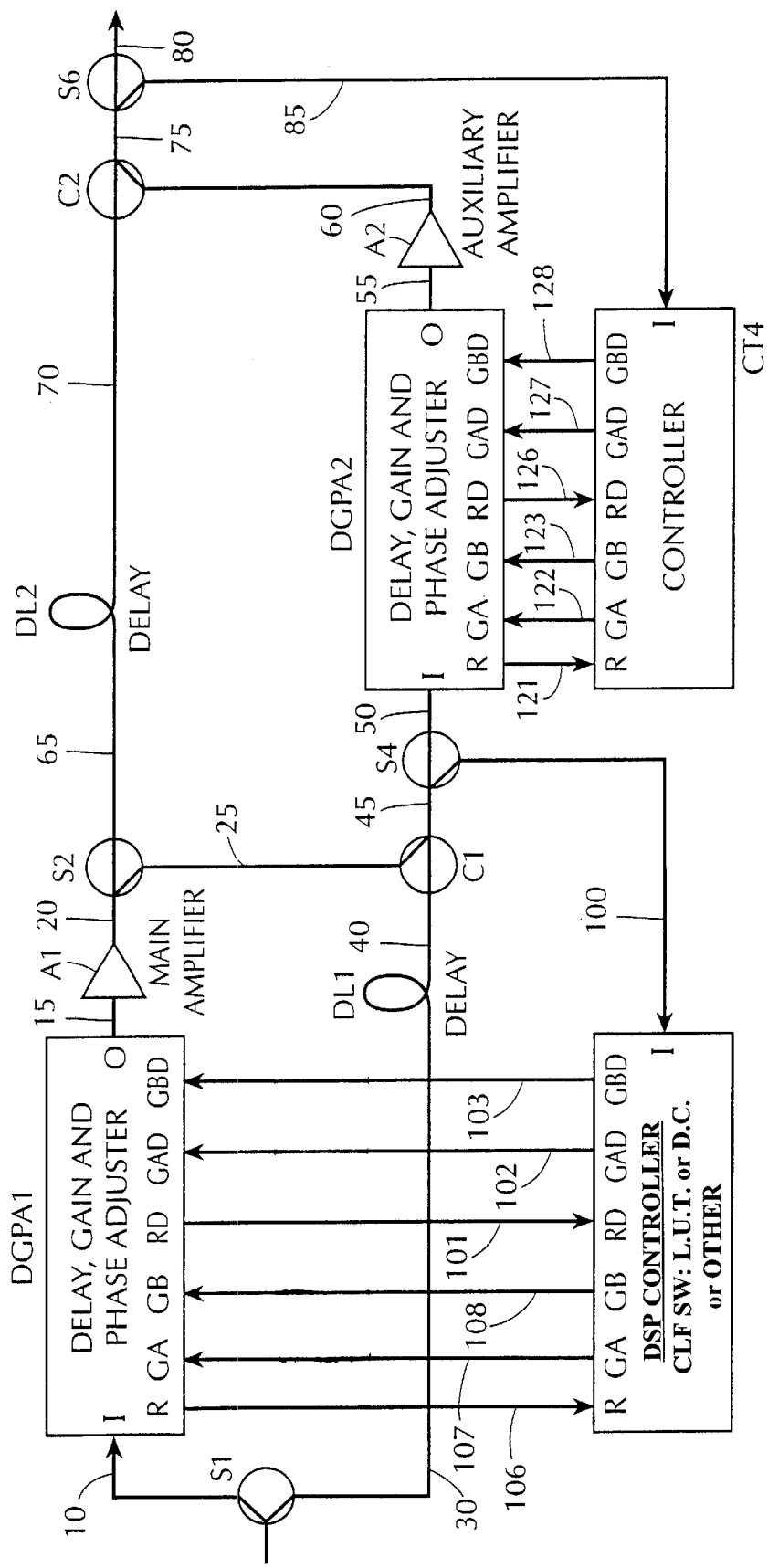
FIG. 14 depicts a feedforward amplifier that incorporates the control linearization functions in a DSP controller.

In the DSP implementation of the controller CT3 (CT4), the control linearization function is preferably implemented in the digital signal processor itself, as shown in FIG. 14, instead of in the CLF blocks shown in FIG. 13. While this implementation results in a hardware block diagram that is identical to the prior art system shown in FIG. 9, the system in accordance with the present invention differs from the prior art system because the DSP software performs the linearization. Implementation of this linearization may be performed in the DSP, for example, by table look-up or by direct computation of the curve. The specifics of implementing the linearization algorithm in software will be apparent to persons skilled in the relevant art.

While the CLFs in FIGS. 13 and 14 are illustrated in the signal cancellation section of the feed forward amplifier, CLFs may be also used in the distortion cancellation section (or in both the signal cancellation section and the distortion cancellation section).

Figure 1:
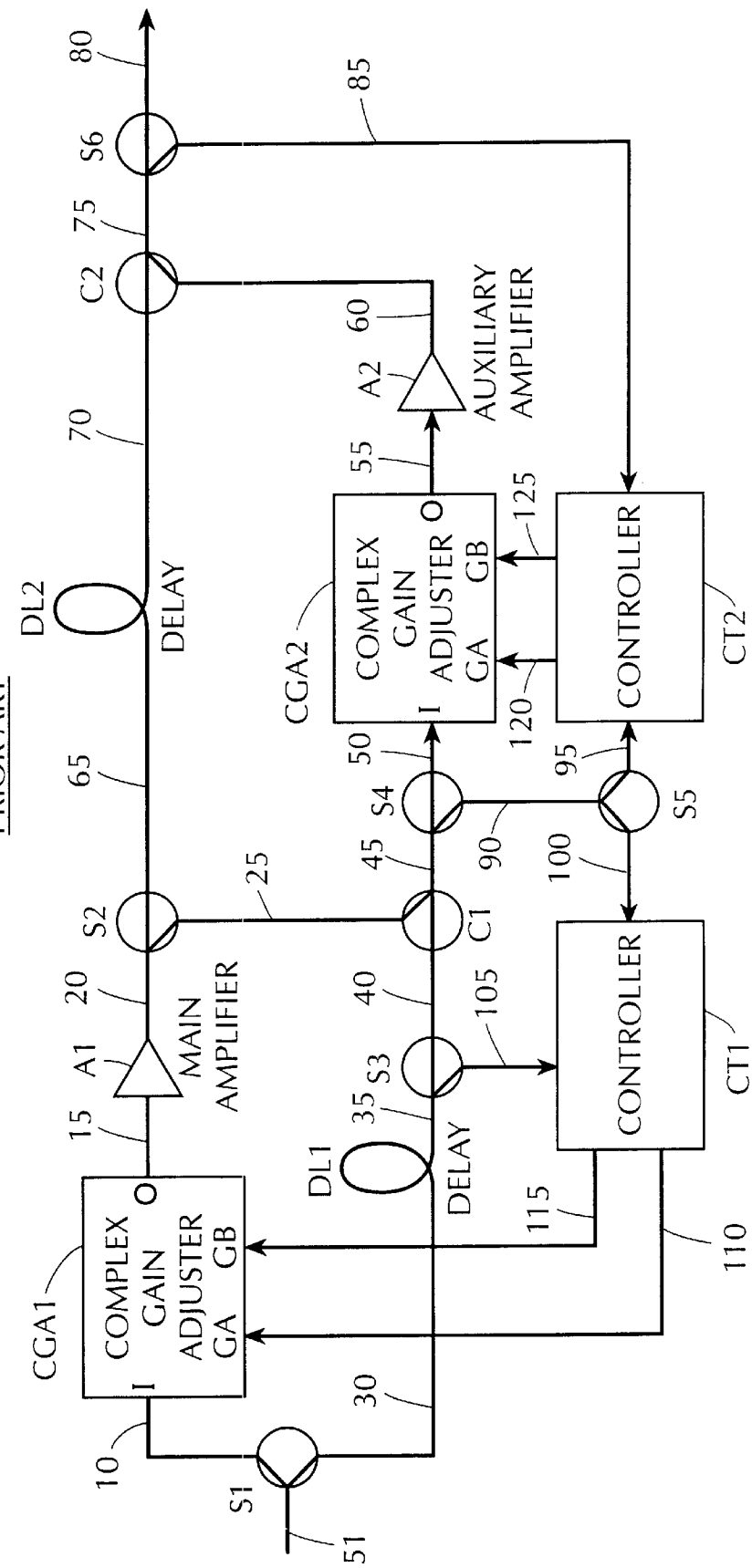
FIG. 1 is a block diagram of a prior art adaptive feed forward amplifier.

In addition, while FIGS. 13 and 14 show CLFs that are added to the dual branch DGPA, the concept of linearizing the inputs to the DGPA using either a CLF or DSP software can also be applied to DGPAs having three or more branches. For example, in the embodiment shown in FIG. 12, CLFs would be added in the control lines of the CGAs 211, 212, and 213. Linearization may even be applied to traditional feedforward amplifiers that use only a single CGA in the signal cancellation section. For example, to modify the embodiment shown in FIG. 1 in accordance with this aspect of the present invention, CLFs would be added in the GA and GB control lines between the controller CT1 and the complex gain adjuster CGA1.

As will be apparent to those skilled in the art in the light of the foregoing disclosure, many alterations and modifications are possible in the practice of this invention without departing from the spirit or scope thereof. Accordingly, the scope of the invention is to be construed in accordance with the following claims.

I claim:
1. An amplifier comprising:
   a main amplifier that generates an intermediate amplified signal;
   a main signal adjuster that couples an input signla to the main amplifier, including at least one complex gain adjuster that is controlled by main control signals;
   a first subtracter that subtracts a delayed version of the input signal from the intermediate signal, resulting in an error signal; and
   a main controller that, based on the error signal, generates main control signals which are provided to the main control inputs of the main signal adjuster, wherein the main controller includes at least one control linearizer which adjusts the main control signals to compensate for nonlinearities in the main signal adjuster's response to the main control inputs, wherein the transfer function of the control linearizer is:

$$Vout=sqrt(Vin).$$

2. An amplifier comprising:

a main amplifier that generates an intermediate amplified signal;

a main signal adjuster that couples as input signla to the main amplifier, including at least one complex gain adjuster that is controlled by main control signals;

a first subtracter that subtracts a delayed version of the input signal from the intermediate signal, resulting in an error signal; and a main controller that, based on the error signal, generates main control signals which are provided to the main control inputs of the main signal adjuster, wherein the main controller includes at least one control linearizer which adjusts the main control signals to compensate for nonlinearities in the main signal adjuster's response to the main control inputs, wherein the control linearizer adjusts the main control signals by using a look-up table implementing the transfer function of the control linearizer.

3. An amplifier comprising:

a main amplifier that generates an intermediate amplified signal;

a main signal adjuster that couples an input signal to the main amplifier, including at least one complex gain adjuster that is controlled by main control signals;

a first subtracter that subtracts a delayed version of the input signal from the intermediate signal, resulting in an error signal; and a main controller that, based on the error signal, generates main control signals which are provided to the main control inputs of the main signal adjuster, wherein the main controller includes at least one control linearizer which adjusts the main control signals to compensate for nonlinearities in the main signal adjuster's response to the main control inputs, wherein the control linearizer adjusts the main control signals by directly computing the transfer function of the control linearizer.

4. An amplifier comprising:

a main amplifier that generates an intermediate amplified signal;

a main signal adjuster that couples an input signal to the main amplifier, including at least one complex gain adjuster that is controlled by main control signals;

a first subtracter that subtracts a delayed version of the input signal from the intermediate signal, resulting in an error signal;

a main controller that, based on the error signal, generates main control signals which are provided to the main control inputs of the main signal adjuster, wherein the main controller includes at least one control linearizer which adjusts the main control signals to compensate for nonlinearities in the main signal adjuster's response to the main control inputs;

an auxiliary amplifier that generates an amplified version of the error signal;

an auxiliary signal adjuster that couples the error signal to the auxiliary amplifier, the auxiliary signal adjuster including at least one complex gain adjuster that is controlled by auxiliary control inputs;

a second subtracter that subtracts the amplified version of the error signal from a delayed version of the intermediate signal, resulting in an output signal; and an auxiliary controller that, based on the output signal, generates auxiliary control signals which are provided to the auxiliary signal adjuster, the auxiliary controller including at least one control linearizer which adjusts the auxiliary control signals to compensate for nonlinearities in the auxiliary signal adjuster's response to the auxiliary control imputs.

5. A feedforward linearizer comprising:

a signal adjusting circuit; and at least one control linearizer coupled to the signal adjusting circuit, the at least one control linearizer having a transfer function such that the response of the signal adjusting circuit is substantially linear with respect to a control signal generated by the at least one control linearizer and applied to the signal adjusting circuit.

6. A feedforward linearizer according to claim 5, wherein the signal adjusting circuit comprises at least two branches.

7. A feedforward linearizer according to claim 5, wherein one branch has no delay line and at least one other branch includes a delay line.

8. A feedforward linearizer according to claim 6, wherein each branch of the signal adjusting circuit includes a signal adjuster, wherein inputs to each signal adjuster are generated by respective control linearizers.

9. A feedforward linearizer according to claim 8, wherein each signal adjuster is a complex gain adjuster, and inputs to each complex gain adjuster are generated by respective control linearizers.

10. A feedforward linearizer according to claim 5, wherein the control linearizer is implemented in a controller.

11. A feedforward linearizer according to claim 5, wherein the signal adjusting circuit forms a portion of a signal cancellation circuit.

12. A feedforward linearizer according to claim 5, wherein the signal adjusting circuit forms a portion of a distortion cancellation circuit.

13. A feedforward linearizer comprising:

a first signal adjusting circuit which forms a portion of a signal cancellation circuit; and a second signal adjusting circuit which forms a portion of a distortion cancellation circuit, wherein the first and second signal adjusting circuits are each coupled to at least one control linearizer having a transfer function such that the response of the signal adjusting circuit is substantially linear with respect to a control signal generated by the at least one control linearizer and applied to the signal adjusting circuit.

14. A feedforward linearizer according to claim 11, the signal cancellation circuit further comprising a delay line, wherein the delay line and the signal adjusting circuit are in the same signal path.

15. A feedforward linearizer according to claim 5, wherein the signal adjusting circuit includes a signal adjuster, and the transfer function of the at least one control linearizer is substantially the inverse of the transfer function of the signal adjuster.

16. A feedforward linearizer according to claim 15, wherein the signal adjuster has a squared transfer function, and the at least one control linearizer has a square root transfer function.

17. A feedforward linearizer according to claim 10, wherein the controller comprises a digital signal processor, and the at least one control linearizer is implemented in software running on the digital signal processor.

18. A feedforward linearizer according to claim 17, wherein the at least one control linearizer implements the transfer function by using a look-up table.

19. A feedforward linearizer according to claim 17, wherein the at least one control linearizer implements the transfer function by using direct computation.

* * * * *

UNITED STATES PATENT AND TRADEMARK OFFICE
CERTIFICATE OF CORRECTION

PATENT NO.      : 6,414,546 B2                                                    Page 1 of 1
DATED           : July 2, 2002
INVENTOR(S)     : James K. Cavers It is certified that error appears in the above-identified patent and that said Letters Patent is hereby corrected as shown below:

Title page, Item [54] and Column 1, line 1,
"RFPOWER" should read -- RF POWER --.

Title page,
Insert item: -- [65]      PRIOR PUBLICATION DATA
                          US 2001/0002114 A1 May 31, 2001 --.

Column 1,
Line 27, "cancellation-circuit" should read -- cancellation circuit --.

Column 8,
Line 2, "with a" should read -- with --; and
Line 66, "cach" should read -- of each --.

Column 10,
Line 52, "signla" should read -- signal --.

Column 11,
Line 4, "as input" should read -- an input --; and
"signla" should read -- signal --.

Column 12,
Line 13, "claim 5" should read -- claim 6 --.

Signed and Sealed this

Twelfth Day of August, 2003

JAMES E. ROGAN
*Director of the United States Patent and Trademark Office*